United States Patent [19]

Tsukamoto

[11] Patent Number: 5,458,734
[45] Date of Patent: Oct. 17, 1995

[54] METHOD OF FABRICATING A SEMICONDUCTOR DEVICE

[75] Inventor: Hironobu Tsukamoto, Tokyo, Japan

[73] Assignee: NEC Corporation, Japan

[21] Appl. No.: 332,651

[22] Filed: Nov. 1, 1994

Related U.S. Application Data

[63] Continuation of Ser. No. 964,709, Oct. 22, 1992, abandoned.

[30] Foreign Application Priority Data

Oct. 25, 1991 [JP] Japan .................................. 3-279392

[51] Int. Cl.⁶ .................................................. H01L 21/00
[52] U.S. Cl. ................................ 156/643.1; 156/646.1; 156/651.1; 156/644.1; 156/662.1
[58] Field of Search ................................... 156/643, 646, 156/662, 644, 651

[56] References Cited

U.S. PATENT DOCUMENTS 4,579,623  4/1986  Suzuki et al. .................. 156/643 X
4,604,162  8/1986  Sobczak .......................... 156/643 X
4,729,815  3/1988  Leung ............................. 156/643
4,855,017  8/1989  Douglas .......................... 156/646 X
4,992,136  2/1991  Tachi et al. .................... 156/643

*Primary Examiner*—Thi Dang
*Attorney, Agent, or Firm*—Laff, Whitesel, Conte & Saret, Ltd.

[57] ABSTRACT

A method of fabricating a semiconductor device wherein, when etching a single-crystal silicon film or polysilicon film according to a dry etching process in which $SF_6$ is used as a main etching gas, a deposition film is formed beforehand on the surface of the material to be etched by performing etching using a fluorine family etching gas which contains C and H. In the initial stage of etching, by using this deposition film as a mask to prevent etching in the vertical direction (direction of depth), etching of the material advances in the horizontal direction and thus the material having tapered etched shape is obtained. In doing so, there are accomplished good filling properties and good coverage and levelness.

12 Claims, 4 Drawing Sheets

METHOD OF FABRICATING A SEMICONDUCTOR DEVICE

This application is a continuation of application Ser. No. 07/964,709, filed Oct. 22, 1992, now abandoned.

BACKGROUND OF THE INVENTION

1. Field of the Invention

This invention relates to a method of fabricating a semiconductor device, and in more particular to a method of fabricating a semiconductor device using plasma etching as dry etching.

2. Description of the Prior Art

When a deep trench 9 is formed in a single-crystal silicon substrate 1 using a photoresist as a mask material 2, as shown in FIGS. 1A to 1B, and if etching is performed using an etching gas containing $SF_6$ as the main etching gas, for example, $SF_6+F_{115}$, $SF_6+F_{12}$, $SF_6+CCl_4$, $SF_6+Cl_2$, or $SF_6+F_{21}$, due to deposition of carbon from the photoresist, projecting parts 10 are formed at an opening portion 11 of the trench 9 so that the opening portion 11 becomes narrow (see FIG. 1B).

When an insulating material 4 such as polysilicon or an oxide film is filled or buried into the aforementioned trench 9, it is easy for a cavity, i.e. a nest 8 to be formed in the opening portion 11 of the trench 9 where it is not completely filled with the insulating material (see FIG. 1C).

When this kind of cavity occurs, a depression is formed when etching is performed, and when heat treatment is performed, it becomes easy for stress to occur in the silicon substrate 1.

Also, as shown in FIG. 2A, when forming wiring 13 by etching a polysilicon film 5 (resistance wire, etc.) on a single-crystal silicon substrate 1 using a photoresist as a mask 2 and using an etching as which contains $SF_6$ as the main etching gas, if the etching anisotropy is increased, coverage of an interlayer insulating film or insulator 6 and its top wiring material layer 7 on the wiring 13 formed in a later process becomes poor (see FIG. 2C). When etching is performed isotropically in an attempt to improve the coverage, and when P or As is used as a dopant in the polysilicon film 5, sideways etching or undercutting 12 becomes large, and thus it is difficult to control the dimensions of the wiring 13 (see FIG. 2B).

In the prior etching method:

(1) When a deep trench is formed in the silicon substrate by etching and an insulating material is filled or buried into the trench, it is easy for a cavity or cavities to be formed in or near the opening portion causing the trench to be poorly filled and causing stress in the single-crystal silicon substrate.

(2) When wiring is formed by etching the polysilicon, a problem exists in that coverage of the top layers on the wiring is poor and the dimension of the wiring are poor due to sideways etching of the polysilicon itself.

SUMMARY OF THE INVENTION

An object of this invention is to provide a method of fabricating a semiconductor device in which an element having an etched taper or a tapered etched shape can be easily obtained with improved filling properties and levelness.

The object of this invention is effectively accomplished by providing a method of fabricating a semiconductor device in which single-crystal silicon or polysilicon is etched using an etching gas which contains $SF_6$ or $NF_3$ as a main etching gas, comprising forming a deposition film on a surface to be etched before etching the single-crystal silicon or polysilicon, to thereby obtain a tapered etched shape.

DESCRIPTION OF THE PREFERRED EMBODIMENTS

According to this invention, in the process of etching an element such as single-crystal silicon or polysilicon using a prescribed etching gas, a deposition film is formed in advance on the surface to be etched, and in the initial stage of the etching process, this deposition film functions as a masking material against etching in the vertical direction, and the sideways etching is performed on the material to be etched in the horizontal direction. This deposition film can be formed in a separate chamber, for example, by etching the surface of the silicon or polysilicon using a fluorine family etching gas which contains C and H.

The etching gas for forming the deposition film includes, for example, $CH_2F_2$, $CHF_3+O_2$, $CHF_3+CF_4+(O_2)$, and $CHF_3+C_2F_6+(O_2)$. It is preferred that the $CHF_3+O_2$ gas contains 70–100 vol. % of $CHF_3$, and that the $CHF_3+CF_4+(O_2)$ and $CHF_3+C_2F_6+(O_2)$ gases contain 50–80 vol. % of $CHF_3$.

Prior to etching the surface of the silicon or polysilicon to form the deposition film as mentioned above, a pre-etching process may be performed using a fluorine family gas which may contain C and H, preferably $CHF_3+CF_4+(O_2)$ or $CHF_3+C_2F_6+(O_2)$ which contains 0–30 vol. % of $CHF_3$. This can lead to more preferable results as mentioned below.

Next, this invention will be described in more detail with reference to the drawings.

Figure 1A:
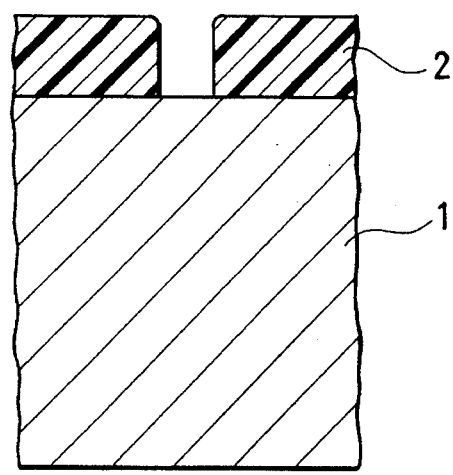
FIGS. 1A to 1C are partially cross-sectional views showing a prior technology of forming deep trenches in a silicon substrate in a fabricating method of a semiconductor device.
Figure 1B:
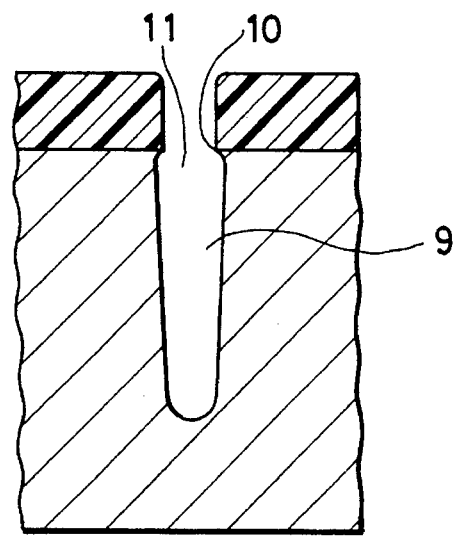
Figure 1C:
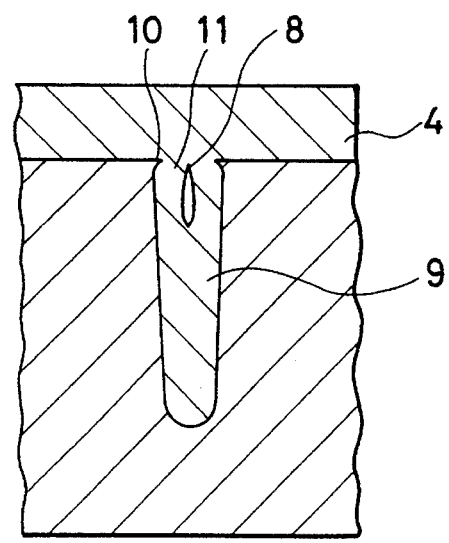
Figure 2A:
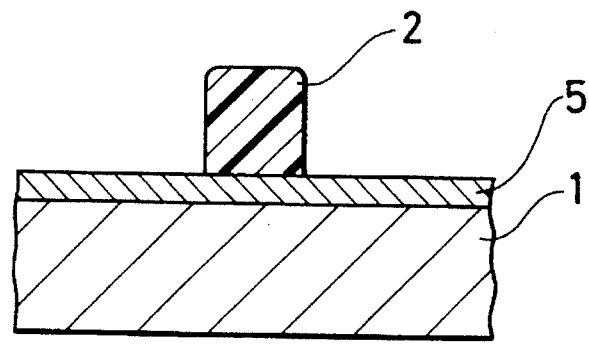
FIGS. 2A to 2C are partially cross-sectional views showing a prior technology of forming polysilicon wiring in a fabricating method of a semiconductor device.
Figure 2B:
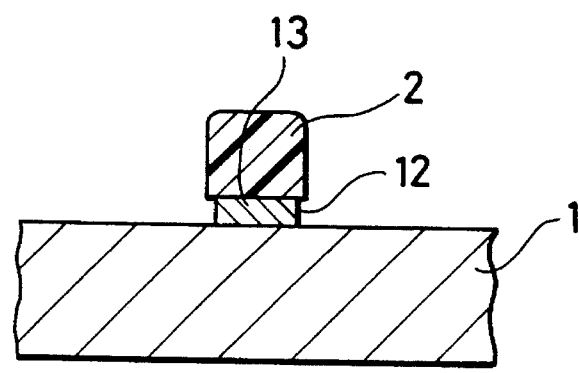
Figure 2C:
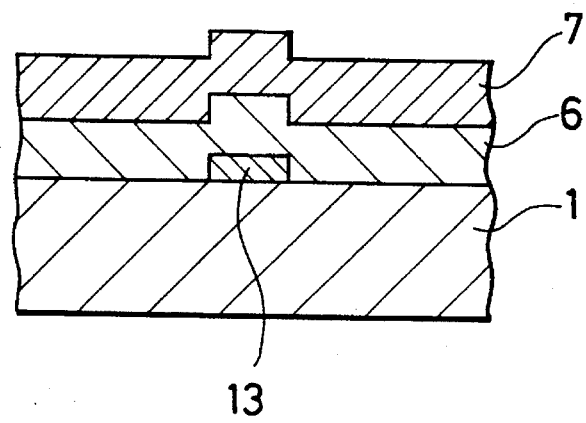
Figure 3A:
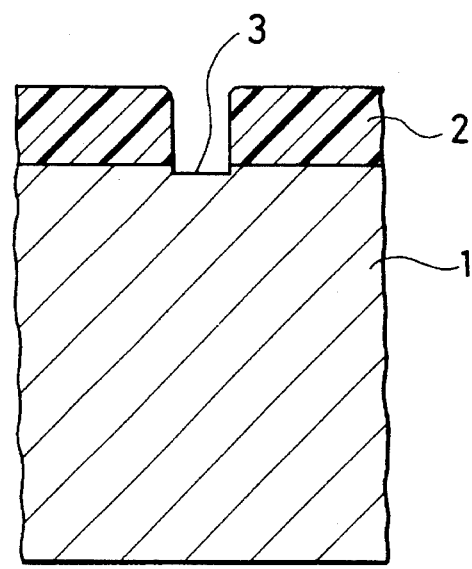
FIGS. 3A to 3C are partially cross-sectional views showing a method of fabricating a semiconductor device of an embodiment of this invention.
Figure 3B:
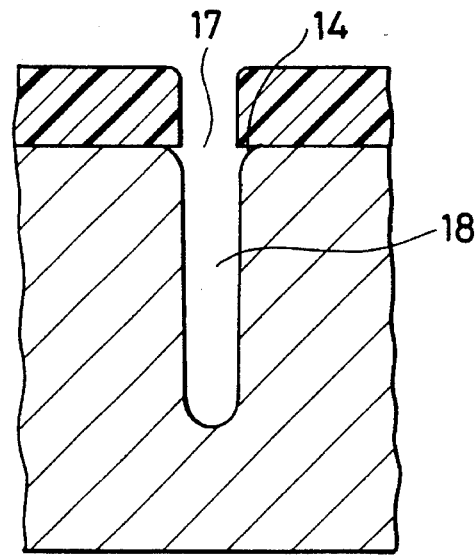
Figure 3C:
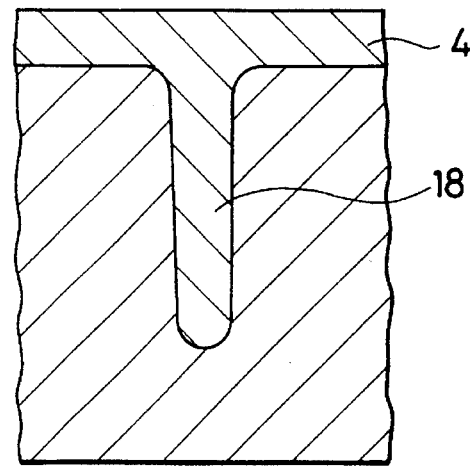

Referring now to FIGS. 3A to 3C which are partially cross-sectional views showing a method of fabricating a semiconductor device of a first embodiment of this invention, in fabricating this semiconductor device, first, a mask 2 is formed on a single-crystal silicon substrate 1 using a photoresist, which is known in the art, according to photolithography technology. Next, after the single-crystal silicon substrate 1 has been pre-etched approximately 100 nm using a fluorine family etching gas, such as $CF_4$, everywhere where there is no mask, an about 10 nm thick C—H deposition film 3 is formed on the silicon substrate 1 by etching the pre-etched surface using a fluorine family etching gas such as $CHF_3+O_2$ which contains 90 vol. % of $CHF_3$ (see FIG. 3A).

The semiconductor device which has been processed as mentioned above is moved to a different chamber or different device, and is etched using an etching gas which contains $SF_6$ or $NF_3$ as its main gas, according to a known etching process in the art. The $SF_6$-containing gas includes, for example, $SF_6+F_{115}$, $SF_6+F_{12}+(N_2)$, $SF_6+CCl_4$, $SF_6+Cl_2+(CHF_3)$, and $SF_6+F_{21}$. It is preferred that the gas contains 30–90 vol. % of $SF_6$. The $NF_3$-containing gas includes, for example, $NF_3+HBr$, $NF_3+Cl_2+(CHF_3)$, $NF_3+CCl_4$, and $NF_3+BCl_3$. It is preferred that the gas contains 15–50 vol. % of $NF_3$.

For example, in the case of a parallel flat plate type dry-etching device, when the direct current bias across between both electrodes is kept to 10 V or less, the thin C-H deposition film 3 serves as a mask in the initial stage of the etching process, and etching advances in the horizontal direction in only the portion for which etching in the vertical direction is suppressed, therefore, it is easy for the single-crystal silicon substrate 1 to be etched sideways. During the etching process, the thin C—H deposition film 3 disappears, and etching advances while sideways etching of the silicon substrate 1 gradually becomes smaller, and as shown in FIG. 3B, a trench 18 with tapered smooth (rounded) corners or edges 14 in an opening portion 17 is formed.

When the trench 18 with the aforementioned shape is filled or buried with an insulating material 4 such as polysilicon or an oxide film, since the trench is shaped so that it gets wider as it gets closer to the opening portion, the trench 18 is completely filled with the insulating material 4 without forming cavities therein.

Figure 4A:
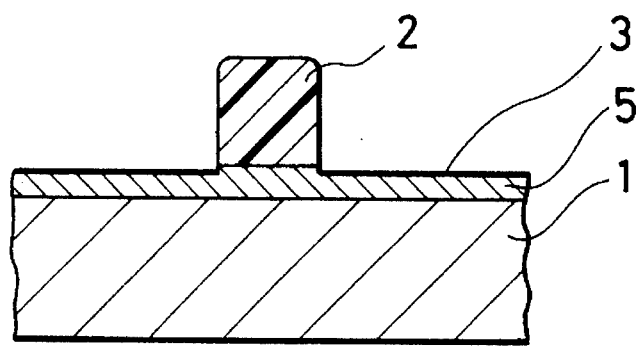
FIGS. 4A to 4C are partially cross-sectional views showing a method of fabricating a semiconductor device of another embodiment of this invention.
Figure 4B:
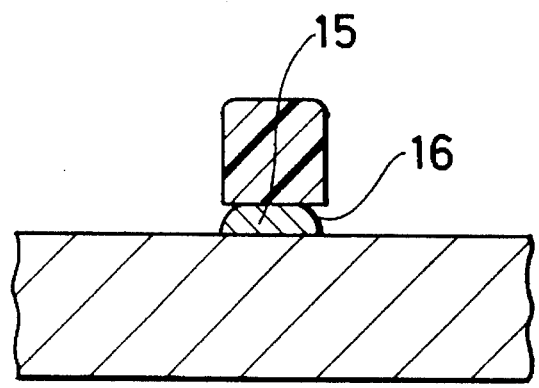
Figure 4C:
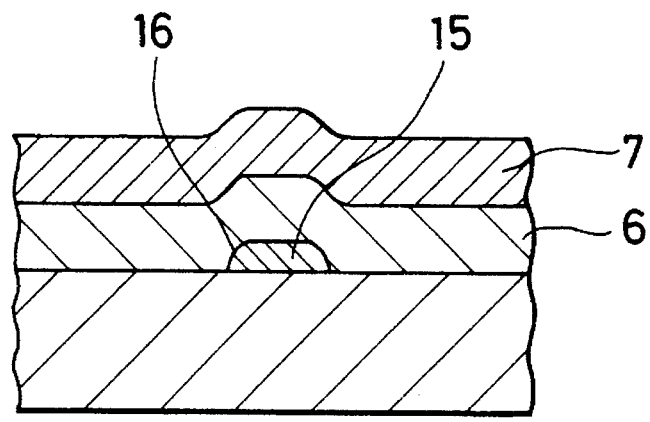

Referring now to FIGS. 4A to 4C which are partially cross-sectional views showing a method of fabricating a semiconductor device for a second embodiment of this invention, in fabricating this semiconductor device, first, a polysilicon film 5 is formed on a single-crystal silicon substrate 1, and then a mask 2 is formed on top of the polysilicon film 5 using photolithography technology. Next, after the polysilicon film 5 is pre-etched approximately 30 to 50 nm using a fluorine family etching gas, such as $CF_4+O_2$, everywhere where there is no mask, an about 10 nm thick C—H deposition film 3 is formed on the surface of the polysilicon film 5 by etching the pre-etched surface with a fluorine family etching gas such as $CHF_3+O_2$ which contains 90 vol. % of $CHF_3$ (see FIG. 4A).

The semiconductor device which has been processed as mentioned above is etched using an etching gas which contains $SF_6$ or $NF_3$ as its main gas, as described in the above first embodiment. In the initial stage of the etching process, etching advances in the horizontal direction rather than in the vertical direction (depth) due to the C—H deposition film 3, therefore, as shown in FIG. 4B, wiring 15, of which the upper corners or edges 16 have a radiused taper, is formed.

To the stepped surface formed as mentioned above, an interlayer insulating film 6 is formed using a CVD method, and then a wiring material film 7 is formed on the insulating film 6 using a sputtering method, obtaining very good coverage.

In this invention, as described above, a thin deposition film is formed on the surface of a material to be etched, and in the initial stage of the etching process, this deposition film functions as a mask to prevent etching in the vertical direction (depth). Therefore, it is easy to obtain an element having a tapered etched shape, whereby filling properties, coverage and levelness are improved.

It should be readily apparent to those skilled in the art that various changes can be made in the method as described above. It is intended that such changes be covered within the spirit and scope of the invention.

What is claimed is:

1. A method of fabricating a semiconductor device in which a single-crystal silicon or polysilicon is etched by using an etching gas which contains $SF_6$ or $NF_3$ as a main etching gas, said method comprising the step of forming a deposition film on a surface to be main-etched before main-etching said single-crystal silicon or polysilicon, to obtain rounded corners, said deposition film being formed by pre-etching said surface by using a fluorine family etching gas in which said fluorine family etching gas is taken from a group consisting of one of $CH_2F_2$, $CHF_3+O_2$, $CHF_3+CF_4$, $CHF_3+C_2F_6$, $CHF_3+CF_4+O_2$, and $CHF_3+C_2F_6+O_2$ gas where the last two mentioned gases contain $O_2$ at a level which is less than 30 volume %.

2. The method of fabricating a semiconductor device as defined in claim 1 in which said $CHF_3+O_2$ gas contains 70–100 vol. % of $CHF_3$.

3. The method of fabricating a semiconductor device as defined in claim 1 in which said $CHF_3+CF_4$ and $CHF_3+CF_4+O_2$ gas contain 50–80 volume % of $CHF_3$.

4. The method of fabricating a semiconductor device as defined in claim 1 in which said $CHF_3+C_2F_6$ and $CHF_3+C_2H_6+O_2$ gas contain 50–80 volume % of $CHF_3$.

5. A method of fabricating a semiconductor device in which a single-crystal silicon or polysilicon is etched by using an etching gas which contains $SF_6$ or $NF_3$ as a main etching gas, said method comprising the step of forming a deposition film on a surface to be main-etched before main-etching said single-crystal silicon or polysilicon, to obtain rounded corners, said deposition film being formed by pre-etching said surface by using a fluorine family etching gas which contains C and H, and further in which etching of said single-crystal silicon or polysilicon, and forming of said deposition film are performed in separate chambers.

6. A method of fabricating a semiconductor device in which a single-crystal silicon or polysilicon is etched by using an etching gas which contains $SF_6$ or $NF_3$ as a main etching gas, said method comprising the step of forming a deposition film on a surface to be main-etched before main-etching said single-crystal silicon or polysilicon, to obtain rounded corners, said deposition film being formed by pre-etching said surface by using a fluorine family etching gas which contains C and H, and further in which said deposition film is an approximately 10 nm thick C—H deposition film.

7. A method of fabricating a semiconductor device in which a single-crystal silicon or polysilicon is etched by using an etching gas which contains $SF_6$ or $NF_3$ as a main etching gas, said method comprising the step of forming a deposition film on a surface to be main-etched before main-etching said single-crystal silicon or polysilicon, to obtain rounded corners, said deposition film being formed by pre-etching said surface by using a fluorine family etching gas which contains C and H, and further in which said rounded corners are on exposed edges of a trench having an opening portion with radiused corners.

8. A method of fabricating a semiconductor device in which a single-crystal silicon or polysilicon is etched by using an etching gas which contains $SF_6$ or $NF_3$ as a main etching gas, said method comprising the step of forming a deposition film on a surface to be main-etched before main-etching said single-crystal silicon or polysilicon, to obtain rounded corners, said deposition film being formed by pre-etching said surface by using a fluorine family etching gas which contains C and H, and further in which said rounded corners are on edges of wiring having upper radiused corners.

9. A method of fabricating a semiconductor device comprising the steps of:

forming a mask on top of a single-crystal silicon substrate;

pre-etching said top of said single-crystal silicon substrate by using a fluorine family etching gas selected from a group consisting of $CHF_3+CF_4$, $CHF_3+C_2F_6$ $CHF_3+CF_4+O_2$, and $CHF_3+C_2F_6+O_2$ gases, which contain 0–30% volume % of $CHF_3$, everywhere where there is no mask, and etching the resulting surface by using a fluorine family etching gas selected from a group consisting of $CHF_3+O_2$ gas which contains 70–100 volume % of $CHF_3$, and $CHF_3+CF_4$, $CHF_3+C_2F_6$, $CHF_3+CF_4+O_2$, and $CHF_3+C_2F_6+O_2$ gases which contain 50–80 volume % of $CHF_3$, in order to form a C—H deposition film on top of said silicon substrate; and then etching the resulting deposition film and said substrate by using an etching gas, of which a main gas is $SF_6$ or $NF_3$, to form a trench having an opening portion with tapered and radiused corners.

10. The method of fabricating a semiconductor device as defined in claim 9 in which said etching using said $SF_6$ or $NF_3$ and said deposition film formation are performed in separate chambers.

11. A method of fabricating a semiconductor device comprising the steps of:

forming a mask on top of a polysilicon film on a single-crystal silicon substrate;

pre-etching a top of said polysilicon film by using a fluorine family etching gas selected from a group consisting of $CHF_3+CF_4$, $CHF_3+C_2F_6$, $CHF_3+CF_4+O_2$, and $CHF_3+C_2F_6+O_2$ gases, which contain 0–30 volume % of $CHF_3$, everywhere where there is no mask, and etching the resulting surface by using a fluorine family etching gas selected from a group consisting of $CHF_3+O_2$ gas which contains 70–100 volume % of $CHF_3$, and $CHF_3+CF_4$, $CHF_3+C_2F_6$, $CHF_3+CF_4+O_2$, and $CHF_3+C_2F_6+O_2$ gases which contain 50–80 volume % of $CHF_3$ in order to form a C—H deposition film on the surface of said polysilicon film; and then etching the resulting deposition film and said polysilicon film by using an etching gas, of which a main gas is $SF_6$ or $NF_3$, to form wiring having upper tapered radiused corners.

12. The method of fabricating a semiconductor device, as defined in claim 11 in which said etching using said $SF_6$ or $NF_3$ and said deposition film formation are performed in separate chambers.

* * * * *